(12) United States Patent
Jin et al.

(10) Patent No.: US 12,205,996 B2
(45) Date of Patent: Jan. 21, 2025

(54) LDMOS DEVICE AND METHOD FOR PREPARATION THEREOF

(71) Applicant: CSMC TECHNOLOGIES FAB2 CO., LTD., Wuxi New District (CN)

(72) Inventors: Huajun Jin, Wuxi New District (CN); Guipeng Sun, Wuxi New District (CN)

(73) Assignee: CSMC TECHNOLOGIES FAB2 CO., LTD., Wuxi New District (CN)

( * ) Notice: Subject to any disclaimer, the term of this patent is extended or adjusted under 35 U.S.C. 154(b) by 383 days.

(21) Appl. No.: 17/766,406

(22) PCT Filed: Aug. 18, 2020

(86) PCT No.: PCT/CN2020/109700
§ 371 (c)(1),
(2) Date: Apr. 4, 2022

(87) PCT Pub. No.: WO2021/068647
PCT Pub. Date: Apr. 15, 2021

(65) Prior Publication Data
US 2023/0163177 A1    May 25, 2023

(30) Foreign Application Priority Data
Oct. 8, 2019   (CN) .......................... 201910948225.2

(51) Int. Cl.
*H01L 29/40* (2006.01)
*H01L 29/66* (2006.01)
*H01L 29/78* (2006.01)

(52) U.S. Cl.
CPC .......... *H01L 29/404* (2013.01); *H01L 29/401* (2013.01); *H01L 29/66681* (2013.01); *H01L 29/7816* (2013.01)

(58) Field of Classification Search
None
See application file for complete search history.

(56) References Cited

U.S. PATENT DOCUMENTS

2012/0319182 A1    12/2012   Satoh et al.
2015/0048447 A1*    2/2015   Sharma ............... H01L 29/7816
                                                                  438/259
(Continued)

FOREIGN PATENT DOCUMENTS

CN         103035681 A      4/2013
CN         103872123 A      6/2014
(Continued)

*Primary Examiner* — Bilkis Jahan
(74) *Attorney, Agent, or Firm* — MUNCY, GEISSLER, OLDS & LOWE, P.C.

(57) ABSTRACT

The present invention relates to an LDMOS device and a method of forming the device, in which a barrier layer includes n etch stop layers. Insulating layers are formed between adjacent etch stop layers. Since an interlayer dielectric layer and the insulating layers are both oxides that differ from the material of the etch stop layers, etching processes can be stopped at the n etch stop layers when they are proceeding in the oxides, thus forming n field plate holes terminating at the respective n etch stop layers. A lower end of the first field plate hole proximal to a gate structure is closest to a drift region, and a lower end of the n-th field plate hole proximal to a drain region is farthest from the drift region. With this arrangement, more uniform electric field strength can be obtained around front and rear ends of the drift region, resulting in an effectively improved electric field distribution throughout the drift region and thus in an increased breakdown voltage.

15 Claims, 3 Drawing Sheets

(56) References Cited

U.S. PATENT DOCUMENTS

| | | |
|---|---|---|
| 2015/0137230 A1 | 5/2015 | Liao |
| 2016/0149007 A1* | 5/2016 | Chou .................... H01L 29/407 |
| | | 257/339 |
| 2016/0336410 A1 | 11/2016 | Hsiao et al. |
| 2017/0352731 A1* | 12/2017 | Kuo ...................... H01L 29/665 |
| 2019/0221666 A1* | 7/2019 | Bang .................. H01L 29/7835 |
| 2019/0288066 A1* | 9/2019 | Lee .................. H01L 21/26586 |
| 2019/0334032 A1* | 10/2019 | Ho .................... H01L 29/66659 |

FOREIGN PATENT DOCUMENTS

| | | |
|---|---|---|
| CN | 104396004 A | 3/2015 |
| CN | 105826373 A | 8/2016 |
| CN | 106298912 A | 1/2017 |
| CN | 109244140 A | 1/2019 |
| CN | 109390399 A | 2/2019 |
| CN | 109979821 A | 7/2019 |
| JP | 2009519600 A | 5/2009 |
| JP | 2017126664 A | 7/2017 |

* cited by examiner

LDMOS DEVICE AND METHOD FOR PREPARATION THEREOF

RELATED APPLICATION

The present disclosure claims priority to Chinese Patent Application No. 201910948225.2, filed on Oct. 8, 2019, entitled "LDMOS Device and Method for Preparation thereof", the entirety of which is hereby incorporated by reference.

TECHNICAL FIELD

The present disclosure relates to the field of semiconductor technology, and more particularly, to an LDMOS device and a method for preparation thereof.

BACKGROUND

Lateral double-diffused MOSFET (LDMOS) devices are lateral power devices widely used in power integrated circuits thanks to a wide range of advantages including ease of integration with low-voltage signal devices and other devices in single chips, high voltage resistance, high gain and low distortion.

The performance of such power integrated circuits directly depends on the structure and performance of the employed LDMOS devices. Major metrics for assessing the performance of an LDMOS device include its on-resistance and breakdown voltage. A lower on-resistance and a higher breakdown voltage mean better performance of the LDMOS device. Conventionally, the shallow trench isolation (STI) technology is generally used to obtain an increased breakdown voltage. However, in practical use, the inventors have found that this technology tends to lead to an increased on-resistance. Therefore, there is a need to develop an LDMOS device having an increased breakdown voltage not at the cost of a compromise in on-resistance performance.

SUMMARY OF THE INVENTION

The statements in this section merely provide background information related to the present disclosure and do not necessarily constitute prior art.

According to various embodiments of this disclosure, there are provided an LDMOS device and a method of forming the device.

According to one aspect of this disclosure, there is provided a method of forming an LDMOS device, which comprises:
  providing a semiconductor substrate, the semiconductor substrate defining therein a drift region and a body region, the drift region defining therein a drain region, the body region defining therein a source region;
  depositing a barrier layer on the semiconductor substrate, the barrier layer comprising n etch stop layers, wherein n is an integer greater than or equal to 2, wherein the etch stop layers are stacked one above another, and distances from the etch stop layers to the semiconductor substrate increase from the first to n-th etch stop layer, wherein an insulating layer is disposed between the first etch stop layer and the semiconductor substrate, and wherein an insulating layer is disposed between each adjacent two of the etch stop layers; and
  forming an interlayer dielectric layer and etching the interlayer dielectric layer together with the barrier layer to form n field plate holes, wherein the first to n-th field plate holes are disposed on the first to n-th etch stop layers, respectively.

According to another aspect of this disclosure, there is provided an LDMOS device comprising:
  a semiconductor substrate defining therein a drift region and a body region, the drift region defining therein a drain region, the body region defining therein a source region;
  a barrier layer disposed on the semiconductor substrate, the barrier layer comprising n etch stop layers, wherein n is an integer greater than or equal to 2, wherein the etch stop layers are stacked one above another, and distances from the etch stop layers to the semiconductor substrate increase from the first to n-th etch stop layer, wherein an insulating layer is disposed between the first etch stop layer and the semiconductor substrate, and wherein an insulating layer is disposed between each adjacent two of the etch stop layers;
  an interlayer dielectric layer covering the semiconductor substrate; and
  wherein the LDMOS device further comprises n field plates, wherein the first to n-th field plates are disposed on the first to n-th etch stop layers, respectively.

Details of one or more embodiments of the present invention are set forth in the following drawings and detailed description. Other features, objects and advantages of the present invention will become apparent from the description, drawing and claims.

BRIEF DESCRIPTION OF THE DRAWINGS

In order to better describe and illustrate embodiments or examples of those inventions disclosed herein, reference may be made to one or more accompanying drawings. The additional details or examples used to describe the accompanying drawings should not be considered as limitations to the scope of any of the disclosed inventions, the presently described embodiments and/or examples, and the presently understood best mode of these inventions.

FIGS. 2A to 2E are schematic cross-sectional views of structures illustrating the method of FIG. 1, in which FIG. 2E shows the LDMOS device formed in accordance with the embodiment.

DETAILED DESCRIPTION

Objects, features and advantages of the present disclosure will become more apparent upon reading the following more detailed description, which is set forth by way of particular embodiments with reference to the accompanying drawings. It is to be noted that the particular embodiments disclosed herein are intended to be merely illustrative, but not limiting, of this disclosure.

Unless defined otherwise, all technical and scientific terms used herein have the same meaning as commonly understood by one of ordinary skill in the art to which this disclosure belongs. The terminology used herein is for the purpose of describing particular embodiments only and is not intended to be limiting of this disclosure. As used herein, the term "and/or" includes any and all combinations of one or more of the associated listed items.

Figure 1:
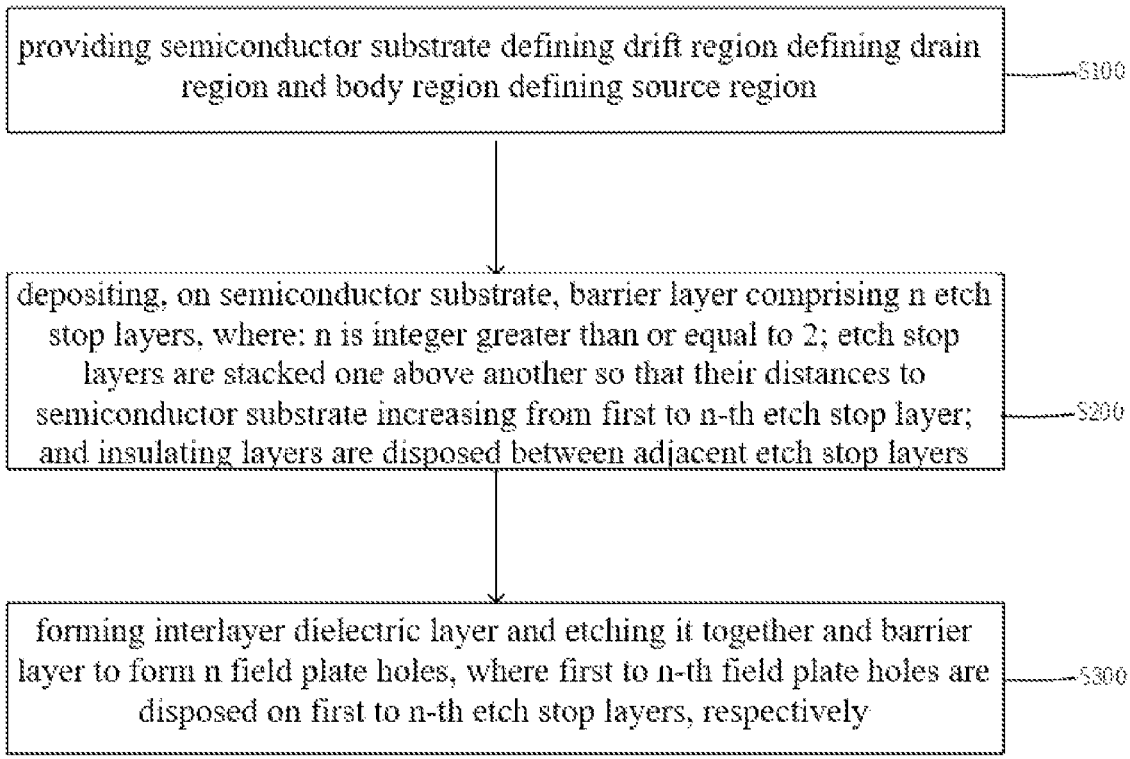
FIG. 1 is a flowchart of a method of forming an LDMOS device according to an embodiment of this disclosure.

Referring to FIG. 1, a method of forming an LDMOS device according to an embodiment of this disclosure includes the steps detailed below.

S100: providing a semiconductor substrate defining therein a drift region and a body region, the drift region defining therein a drain region, the body region defining therein a source region, and forming a gate structure on the semiconductor substrate.

Figure 2A:
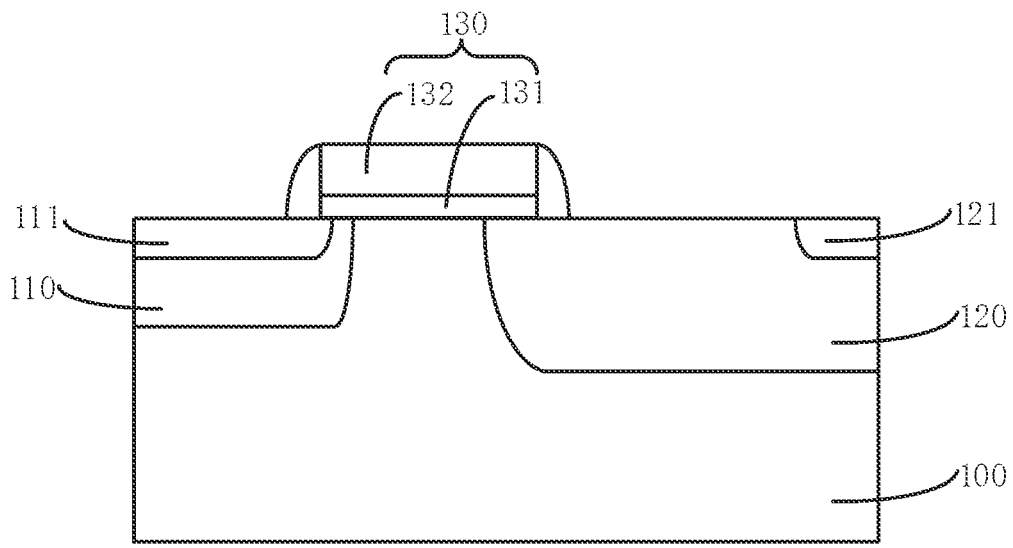

Specifically, referring to FIG. 2A, the semiconductor substrate 100 may be a silicon substrate, a silicon on insulator (SOI) substrate or the like. In the present embodiment, the semiconductor substrate 100 is a p-type silicon substrate that may be formed by epitaxial growth. The body region 110 may be a p-well formed in the semiconductor substrate 100 using a well implantation process. The drift region 120 may be a lightly doped n-type region subsequently formed in the semiconductor substrate 100. The source region 111 may be formed by injecting an n-type dopant into the body region 110, and the drain region 121 may be formed by injecting an n-type dopant into the drift region 120. The doping for the source region 111 and the drain region 121 may be performed at a same time with a same dopant concentration.

The gate structure 130 is formed on the semiconductor substrate 100 and has some overlap with both the body region 110 and the drift region 120. The gate structure 130 may include a gate oxide layer 131 and a gate electrode 132 which are sequentially formed on the semiconductor substrate 100. The gate oxide layer 131 may be silicon dioxide, and the gate electrode 132 may be a metal, polysilicon or the like. The gate structure 130 may further include spacers on both sides of the gate electrode 132.

In the present embodiment, there is no shallow trench isolation (STI) structure formed around the drain region 121. This can result in a significant reduction in the on-resistance of the device being formed.

S200: forming a barrier layer over the semiconductor substrate, the barrier layer including n etch stop layers, where n is an integer greater than or equal to 2, the etch stop layers are stacked one above another in such a manner that their distance to the semiconductor substrate increases from the first to the n-th etch stop layer, and insulating layers are disposed between adjacent etch stop layers.

Figure 2B:
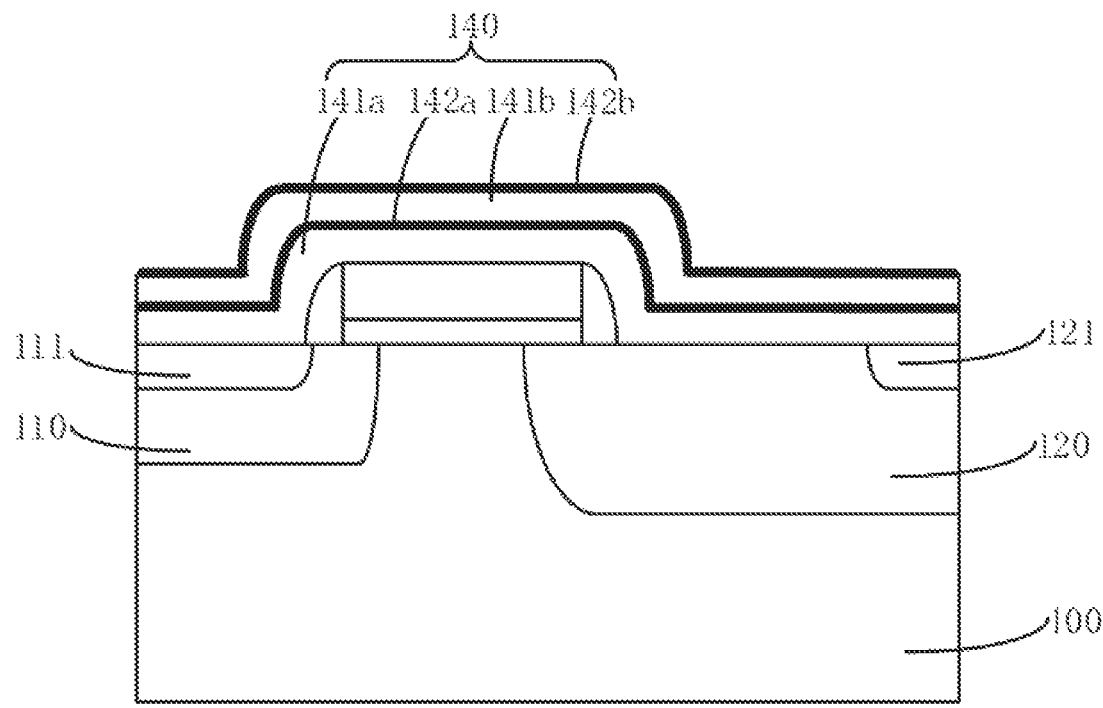

Referring to FIG. 2B, the barrier layer 140 is deposited over the gate structure 130. The barrier layer 140 includes n insulating layers 141 and n etch stop layers 142, which are alternately stacked from the substrate upward in the order: first insulating layer, first etch stop layer, second insulating layer, second etch stop layer, . . . , n-th insulating layer and n-th etch stop layer. The first insulating layer is inserted between the first etch stop layer and the semiconductor substrate. The n is an integer greater than or equal to 2. That is, the barrier layer 140 includes at least two insulating layers 141 and at least two etch stop layers 142. The insulating layers 141 are disposed between adjacent etch stop layers 142 to insulate the adjacent etch stop layers 142.

In the present embodiment, the barrier layer 140 includes two etch stop layers 142 and two insulating layers 141, as an example. As shown in FIG. 2B, the barrier layer 140 includes a first insulating layer 141a, a first etch stop layer 142a, a second insulating layer 141b and a second etch stop layer 142b. The first insulating layer 141a and the second insulating layer 141b may be formed of the same material such as silicon oxide. The first etch stop layer 142a and the second etch stop layer 142b may be formed of the same material such as silicon nitride.

In the present embodiment, each insulating layer 141 has a uniform thickness, and each etch stop layer 142 also has a uniform thickness. The thicknesses of the insulating layers 141 will have an impact on depletion of the drift region 120.

If the insulating layers 141 are too thin, the depletion of the drift region 120 will be too fast, which may make it impossible to increase the breakdown voltage. However, if the insulating layers 141 are too thick, the drift region 120 may not be able to be completely depleted. For these reasons, according to this disclosure, the thicknesses of the first insulating layer 141a and the second insulating layer 141b may be in the range of 500 Å to 2000 Å, such as 500 Å, 1000 Å, 1500 Å or 2000 Å. Preferably, they may be both 1000 Å. The thicknesses of the first etch stop layer 142a and the second etch stop layer 142b may be in the range of 100 Å to 200 Å, such as 100 Å, 150 Å or 200 Å. Preferably, they may be both 150 Å.

Figure 2C:
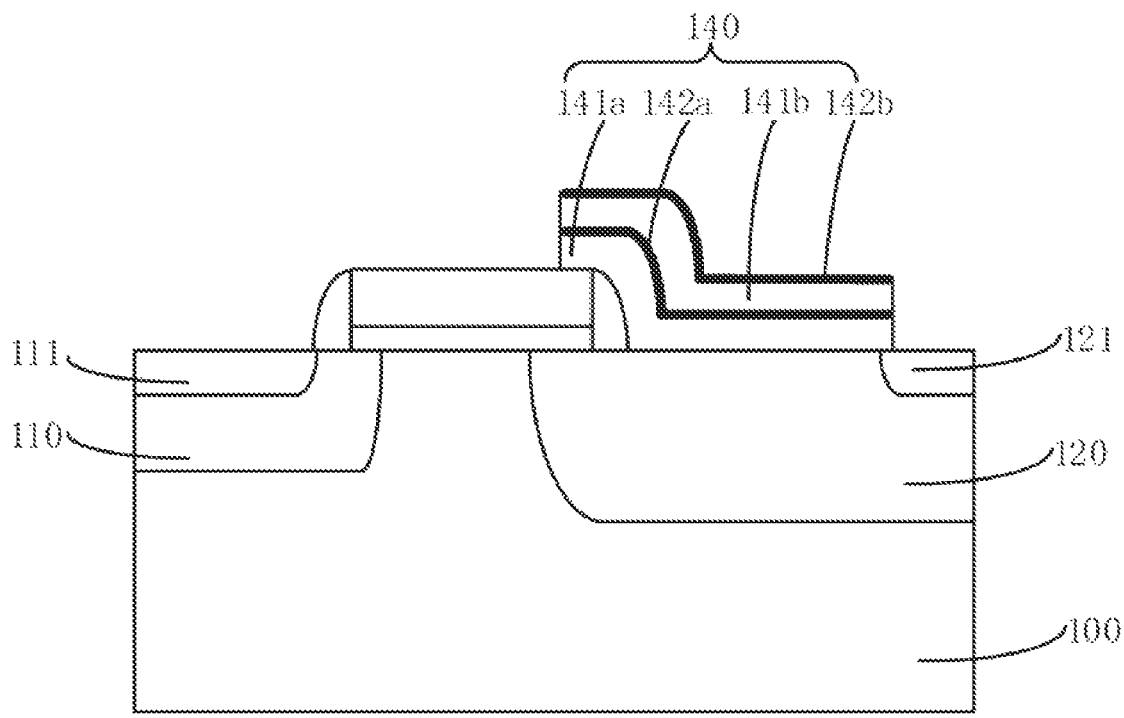

Subsequently, photoresist is applied to a surface of the second etch stop layer 142b, followed by a sequence of processes such as exposure and development, thus forming a pattern of openings in the photoresist. With the remainder of the photoresist serving as a mask, a dry etching technique is employed to successively etch through the second etch stop layer 142b, the second insulating layer 141b, the first etch stop layer 142a and the first insulating layer 141a so that the remainder of the barrier layer 140 spans both the gate electrode 132 and the drain region 121. That is, the remainder of the barrier layer 140 covers the drift region 120 and extends over the gate electrode 132 on one side and over the drain region 121 on the opposite side, as shown in FIG. 2C. This is followed by removal of the photoresist on the surface of the second etch stop layer 142b. The barrier layer 140 can increase the distance between the drain region 121 and the polysilicon gate electrode in the gate structure 130, resulting in an additional increase in the device's breakdown voltage. In the present embodiment, an overlap of the barrier layer 140 with the gate structure 130 may have a length of 0.1 μm to 0.2 μm.

S300: forming an interlayer dielectric layer and then etching the interlayer dielectric layer and the barrier layer, to form first to n-th field plate holes above the first to n-th etch stop layers, respectively.

Figure 2D:
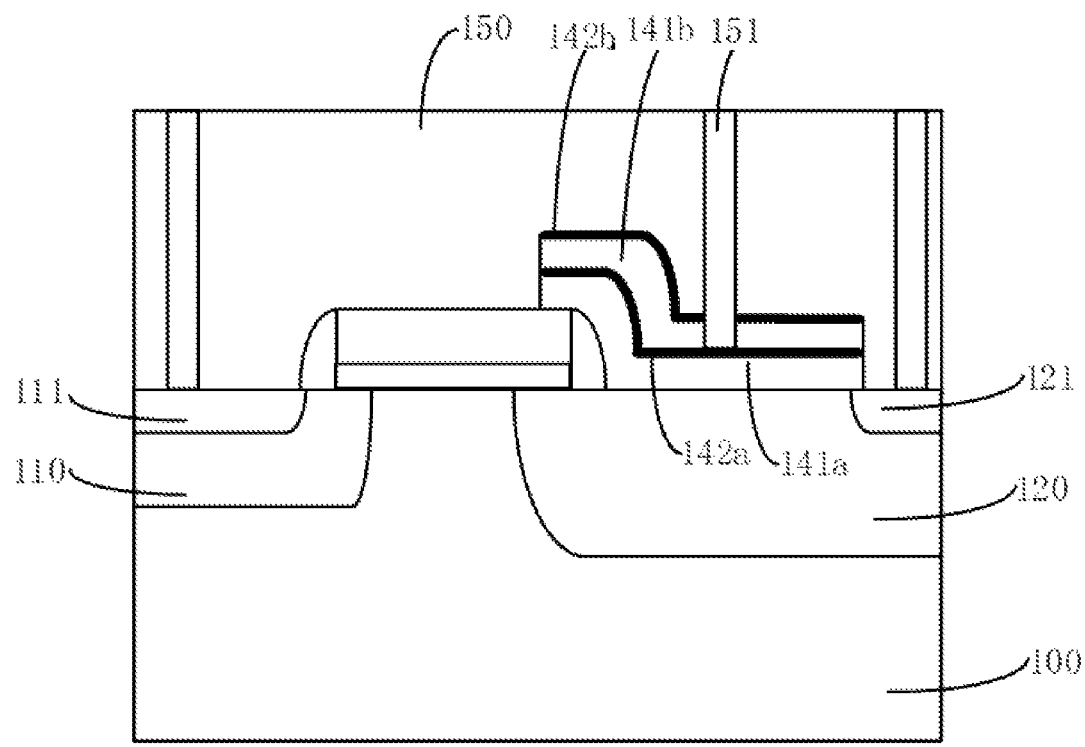

Referring to FIG. 2D, the interlayer dielectric layer 150 is deposited over the structure from the last step. The interlayer dielectric layer 150 may be an oxide. Photoresist may be coated on the interlayer dielectric layer 150 and then patterned so that openings are formed therein. With the photoresist serving as a mask, the interlayer dielectric layer 150 may be etched to further form holes therein.

The etching may further proceed downward in the holes. Since the insulating layers 141 and the etch stop layers 142 are formed of different materials, the resulting field plate holes may terminate at different etch stop layers 142. In the present embodiment, the first to n-th field plate holes terminate at the first to n-th etch stop layers, respectively. In other words, the first field plate hole terminates at the first etch stop layer, the second field plate hole at the second etch stop layer, . . . , and the n-th field plate hole at the n-th etch stop layer.

Specifically, the formation of each of the first to (n−1)-th field plate holes may involve: etching through the interlayer dielectric layer at a low oxide-to-nitride selectivity ratio that means comparable etching rates for oxides and nitrides and thus forming a hole therein, followed by continuation of the etching process in the hole, until the m-th etch stop layer (m is an integer that is greater than 1 and smaller than or equal to n) is reached and etched through; and etching the insulating layer between the m-th and (m−1)-th etch stop layers at an increased oxide-to-nitride selectivity ratio (i.e., a faster etching rate for oxides) until the insulating layer is etched through and the (m−1)-th etch stop layer is exposed, wherein when the etching apparatus detects that the nitride is reached, it ceases the etching process so that a field plate hole terminating at the (m−1)-th etch stop layer, i.e., the (m−1)-th field plate hole, is formed. The other ones of the first to (n−1)-th field plate holes may be formed in a similar manner. The formation of the n-th field plate hole may involve: etching the interlayer dielectric layer at a high oxide-to-nitride selectivity ratio and ceasing the etching process when the etching apparatus detects that the n-th etch stop layer is reached, thus forming the n-th field plate hole terminating at the n-th etch stop layer.

In the present embodiment, lower ends of the first to n-th field plate holes are spaced from the drift region 120 by distances progressively increasing in the direction from the gate structure 130 to the drain region 121. Thus, the first field plate hole is close to the gate structure 130, and the n-th field plate hole is close to the drain region 120. The lower end of the first field plate hole is closest to the drift region 120, and the lower end of the n-th field plate hole is farthest from the drift region 120. With this arrangement, more uniform electric field strength can be obtained around front (proximal to the gate structure 130) and rear (proximal to the drain region 121) ends of the drift region 120, resulting in an increase in the breakdown voltage of the LDMOS device.

Figure 2E:
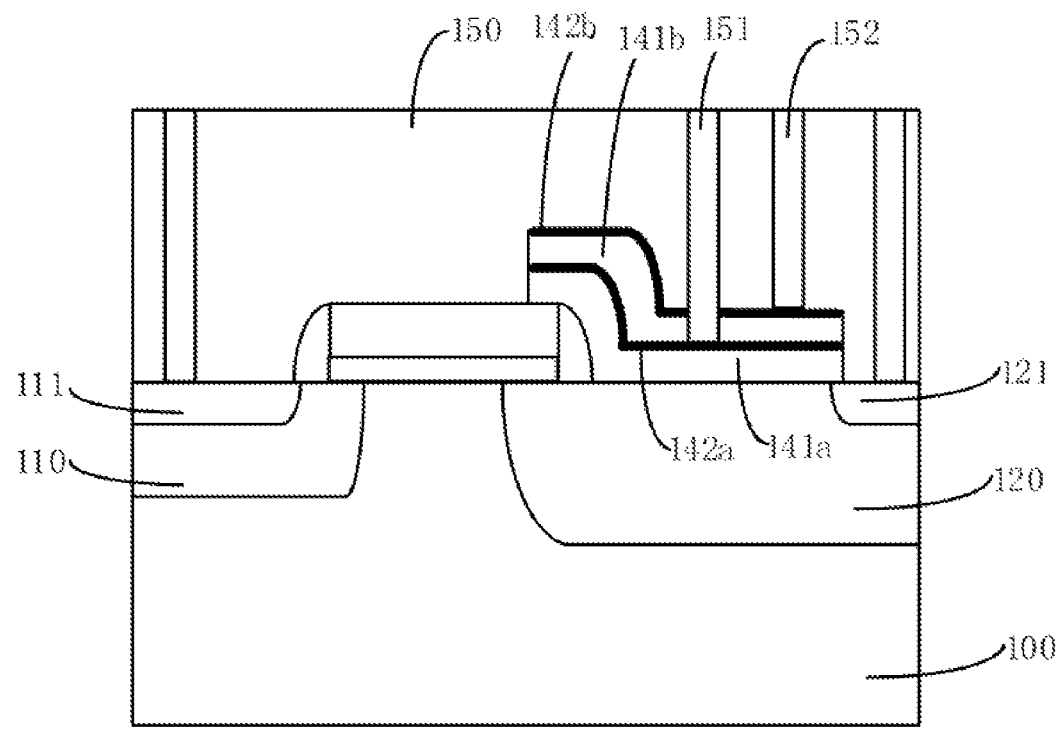

Continuing the example where the barrier layer 140 includes the first insulating layer 141a, the first etch stop layer 142a, the second insulating layer 141b and the second etch stop layer 142b, as shown in FIG. 2D, two field plate holes are formed. At first, the interlayer dielectric layer 150 is etched at a low oxide-to-nitride selectivity ratio. With the etching process proceeding downward within the interlayer dielectric layer 150 and reaching the second etch stop layer 142b, due to the low oxide-to-nitride selectivity ratio that means comparable etching rates for oxides and nitrides, the etching process continuing proceeding into and through the second etch stop layer 142b. Afterwards, the second insulating layer 141b is etched at an increased oxide-to-nitride selectivity ratio, which allows the etching process to proceed in oxides much faster than in nitrides, until the underlying first etch stop layer 142a is exposed. Upon the etching apparatus detecting that the first etch stop layer 142a is reached, the etching is creased, and the first field plate hole 151 is formed. As shown in FIG. 2E, another mask is then used to etch the interlayer dielectric layer 150 at a high oxide-to-nitride selectivity ratio until the second etch stop layer 142b is exposed, and the etching is stopped upon the etching apparatus detecting that the second etch stop layer 142b is reached, thus forming the second field plate hole 152.

During the formation of the first field plate hole 151, source and drain contact holes may be also formed by etching the interlayer dielectric layer 150. Since the formation of the source and drain contact holes involves etching only the oxide of the interlayer dielectric layer 150, it is not affected by any change in the selectivity ratio.

Subsequent to the formation of the n field plate holes and the source and drain contact holes, a metal may be filled in them to form n field plates, a source electrode and a drain electrode. The metal may be tungsten or copper.

In the present embodiment, the barrier layer 140 includes n etch stop layers 142, and the insulating layers 141 are disposed between adjacent etch stop layers 142. Since the interlayer dielectric layer 150 and the insulating layers 141 are both oxides that differ from the material of the etch stop layers 142, the etching processes can be stopped at the n etch stop layers 142 when they are proceeding in the oxides, thus forming the n field plate holes terminating at the respective n etch stop layers 142. The lower end of the first field plate hole in the vicinity of the gate structure 130 is closest to the drift region 120, and the lower end of the n-th field plate hole in the vicinity of the drain region 121 is farthest from the drift region 120. With this arrangement, more uniform electric field strength can be obtained around the front and rear ends of the drift region 120, resulting in an improved electric field distribution throughout the drift region and thus in an increase in the breakdown voltage of the LDMOS device. Further, according to this disclosure, as there is no STI structure around the drain region 121, a lower on-resistance can be obtained. Thus, the device formed in accordance with this disclosure exhibits both a lower on-resistance and an increased breakdown voltage, which result in better performance of the device.

Referring to FIG. 2E, an LDMOS device according to an embodiment of this disclosure includes a semiconductor substrate 100 defining therein a body region 110 and a drift region 120. The body region 110 defines therein a source region 111, and the drift region defines therein a drain region 121. A gate structure 130 is disposed on the semiconductor substrate 100. The gate structure 130 includes a gate oxide layer and a gate electrode which are sequentially disposed on the gate oxide layer. The gate structure 130 further includes spacers on both sides of the gate oxide layer and the gate electrode.

A barrier layer 140 is disposed on the drift region 120 such as to overlap both the gate structure 130 and the drain region 121. The barrier layer 140 can increase the distance between the drain region 121 and the polysilicon gate electrode, resulting in an additional increase in the device's breakdown voltage. The barrier layer 140 includes n etch stop layers 142 over the semiconductor substrate 100, where n is an integer greater than or equal to 2. The n etch stop layers are stacked one above another in such a manner that their distance to the semiconductor substrate 110 increases from the first to the n-th etch stop layer. Insulating layers 141 are disposed between adjacent etch stop layers.

Each of the insulating layers 141 may be formed of silicon oxide and may have a thickness in the range of 500 Å to 2000 Å, such as 500 Å, 1000 Å, 1500 Å or 2000 Å. Preferably, the thickness may be 1000 Å. Each of the etch stop layers 142 may be formed of silicon nitride and may have a thickness in the range of 100 Å to 200 Å, such as 100 Å, 150 Å or 200 Å. Preferably, the thickness may be 150 Å.

The above resulting structure is covered by an interlayer dielectric layer 150 which may be made of the same material as that of the insulating layers 141, such as silicon oxide. In the interlayer dielectric layer 150, n field plates are formed. The first to n-th field plates terminate at the first to n-th etch stop layers, respectively. That is, the first field plate terminates at the first etch stop layer, the second field plate at the second etch stop layer, . . . , and the n-th field plate at the n-th etch stop layer. The n field plates are all metal field plates. The metal may be cobalt or copper. Lower ends of the first to n-th field plates are spaced from the drift region by distances progressively increasing in an order from the first to n-th field plates. The first field plate is located around a front end of the drift region 120 in proximity of the gate structure 130, and the lower end of the first field plate is closest to the drift region 120. The n-th field plate is located around a rear end of the drift region 120 in proximity of the drain region 121, and the lower end of the n-th field plate is farthest from the drift region.

In this LDMOS device, the barrier layer 140 includes n etch stop layers 142, and the insulating layers 141 are disposed between adjacent etch stop layers 142. Since the interlayer dielectric layer 150 and the insulating layers 141 are both oxides that differ from the material of the etch stop layers 142, etching processes can be stopped at the n etch stop layers 142 when they are proceeding in the oxides, thus forming n field plate holes terminating at the respective n etch stop layers 142. The lower end of the first field plate hole in the vicinity of the gate structure 130 is closest to the drift region 120, and the lower end of the n-th field plate hole in the vicinity of the drain region 121 is farthest from the drift region 120. With this arrangement, more uniform electric field strength can be obtained around the front and rear ends of the drift region 120, resulting in an improved electric field distribution throughout the drift region and thus resulting in an increased breakdown voltage. Further, according to this disclosure, there is no STI structure around the drain region 121, so a lower on-resistance can be obtained. Thus, the device formed in accordance with this disclosure exhibits both a lower on-resistance and an increased breakdown voltage, which result in better performance of the device.

The various technical features of the foregoing embodiments may be combined in any way. Although not all such combinations have been described above for the sake of brevity, any of them is considered to fall within the scope of this specification as long as there is no contradiction between the technical features.

Presented above are merely several embodiments of the present disclosure. Although these embodiments are described with some particularity and in some detail, it should not be construed that they limit the scope of the present disclosure in any sense. Note that various variations and modifications can be made by those of ordinary skill in the art without departing from the concept of the present disclosure. Accordingly, it is intended that all such variations and modifications are embraced within the scope of this disclosure as defined in the appended claims.

What is claimed is:

1. A method of forming an LDMOS device, comprising:
    providing a semiconductor substrate defining therein a drift region and a body region, the drift region defining therein a drain region, the body region defining therein a source region;
    depositing a barrier layer on the semiconductor substrate, the barrier layer comprising n etch stop layers, wherein the n is an integer greater than or equal to 2, wherein the etch stop layers are stacked one above another, and distances from the etch stop layers to the semiconductor substrate increase from a first one to an n-th one of the etch stop layers, wherein an insulating layer is disposed between the first one of the etch stop layers and the semiconductor substrate, and wherein an insulating layer is disposed between each adjacent two of the etch stop layers; and
    forming an interlayer dielectric layer and etching the interlayer dielectric layer together with the barrier layer to form n field plate holes, wherein a first one to an n-th one of the field plate holes end on the first one to the n-th one of the etch stop layers, respectively.

2. The method of forming an LDMOS device according to claim 1, wherein a gate structure is formed on the semiconductor substrate, wherein lower ends of the first one to the n-th one of the field plate holes are spaced from the drift region by distances progressively increasing in a direction from the gate structure to the drain region so that the lower end of the first one of the field plate holes proximal to the gate structure is closest to the drift region and the lower end of the n-th one of the field plate holes proximal to the drain region is farthest from the drift region.

3. The method of forming an LDMOS device according to claim 2, wherein both the interlayer dielectric layer and the insulating layers comprise oxides, and the etch stop layers comprise a nitride, and
    wherein the step of etching the interlayer dielectric layer together with the barrier layer to form the n field plate holes comprises:
    for each of the first one to an (n−1)-th one of the field plate holes, etching the interlayer dielectric layer at a low oxide-to-nitride selectivity ratio to form a hole, etching the hole until an m-th one of the etch stop layers is etched through, etching the corresponding insulating layer at an increased oxide-to-nitride selectivity ratio, and ceasing the etching when detecting that the etching reaches an (m−1)-th one of the etch stop layers, so that an (m−1)-th one of the field plate holes is formed on the (m−1)-th one of the etch stop layers, where the m is an integer that is greater than 1 and smaller than or equal to the n; and
    for the n-th one of the field plate holes, etching the interlayer dielectric layer at a high oxide-to-nitride selectivity ratio until the n-th one of the etch stop layers is exposed and ceasing the etching when detecting that the etching reaches the n-th one of the etch stop layers, so that the n-th one of the field plate holes is formed on the n-th one of the etch stop layers.

4. The method of forming an LDMOS device according to claim 3, wherein the step of forming the interlayer dielectric layer and etching the interlayer dielectric layer together with the barrier layer to form the n field plate holes further comprises:
    etching the interlayer dielectric layer to form a source contact hole and a drain contact hole, the source contact hole terminating at the source region, and the drain contact hole terminating the drain region; and
    filling a metal in the source contact hole, the drain contact hole and the n field plate holes to form a source electrode, a drain electrode and n field plates.

5. The method of forming an LDMOS device according to claim 1, wherein the insulating layers each have a thickness of 500 Å to 2000 Å, and/or
    wherein the etch stop layers each have a thickness of 100 Å to 200 Å.

6. The method of forming an LDMOS device according to claim 2, wherein the gate structure comprises a gate oxide layer and a gate electrode which are sequentially disposed on the semiconductor substrate, and spacers on both sides of the gate electrode.

7. The method of forming an LDMOS device according to claim 6, wherein the barrier layer is formed on the drift region and has some overlap with the gate structure and the drain region.

8. An LDMOS device, comprising:
    a semiconductor substrate defining therein a drift region and a body region, the drift region defining therein a drain region, the body region defining therein a source region;
    a barrier layer disposed on the semiconductor substrate, the barrier layer comprising n etch stop layers, wherein n is an integer greater than or equal to 2, wherein the etch stop layers are stacked one above another, and distances from the etch stop layers to the semiconductor substrate increase from a first one to an n-th one of the etch stop layers, wherein an insulating layer is disposed between the first one of the etch stop layers and the semiconductor substrate, and wherein an insulating layer is disposed between each adjacent two of the etch stop layers; and an interlayer dielectric layer covering the semiconductor substrate;

wherein the LDMOS device further comprises n field plates formed from n field plate holes that are formed in the interlayer dielectric layer and the barrier layer and that end on the first one to the n-th one of the etch stop layers respectively, and wherein a first one to an n-th one of the field plates are disposed on the first one to the n-th one of the etch stop layers, respectively.

9. The LDMOS device according to claim 8, wherein a gate structure is formed on the semiconductor substrate, wherein lower ends of the first one to the n-th one of the field plates are spaced from the drift region by distances progressively increasing in a direction from the gate structure to the drain region so that the lower end of the first one of the field plates proximal to the gate structure is closest to the drift region and the lower end of the n-th one of the field plates proximal to the drain region is farthest from the drift region.

10. The LDMOS device according to claim 8, wherein the interlayer dielectric layer comprising an oxide.

11. The LDMOS device according to claim 8, wherein the insulating layers comprise an oxide, and the insulating layers each have a thickness of 500 Å to 2000 Å, and/or
wherein the etch stop layers each have a thickness of 100 Å to 200 Å.

12. The LDMOS device according to claim 9, wherein the barrier layer is formed on the drift region and has some overlap with the gate structure and the drain region.

13. The LDMOS device according to claim 12, wherein the overlap of the barrier layer with the gate structure has a length of 0.1 μm to 0.2 μm.

14. The LDMOS device according to claim 9, wherein the field plates are metal field plates.

15. The LDMOS device according to claim 9, wherein holes of the field plates have a same cross-sectional size.

* * * * *